(12) United States Patent
Lazar et al.

(10) Patent No.: US 8,874,496 B2
(45) Date of Patent: Oct. 28, 2014

(54) ENCODING AND DECODING MACHINE WITH RECURRENT NEURAL NETWORKS

(71) Applicant: The Trustees of Columbia University in the City of New York, New York, NY (US)

(72) Inventors: Aurel A. Lazar, New York, NY (US); Yiyin Zhou, Shanghai (CN)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/948,615

(22) Filed: Jul. 23, 2013

(65) Prior Publication Data

US 2013/0311412 A1 Nov. 21, 2013

Related U.S. Application Data

(63) Continuation of application No. PCT/US2012/024413, filed on Feb. 9, 2012.

(60) Provisional application No. 61/441,203, filed on Feb. 9, 2011.

(51) Int. Cl.
*G06F 15/18* (2006.01)
*G06N 3/08* (2006.01)
*H03M 3/00* (2006.01)
*H03M 1/82* (2006.01)

(52) U.S. Cl.
CPC .............. *G06N 3/08* (2013.01); *H03M 3/502* (2013.01); *H03M 1/82* (2013.01)
USPC .......................................................... 706/16

(58) Field of Classification Search
None
See application file for complete search history.

(56) References Cited

U.S. PATENT DOCUMENTS

| | | | |
|---|---|---|---|
| 5,079,551 | A | 1/1992 | Kimura et al. |
| 5,200,750 | A | 4/1993 | Fushiki et al. |
| 5,392,042 | A | 2/1995 | Pellon |
| 5,392,044 | A | 2/1995 | Kotzin et al. |
| 5,393,237 | A | 2/1995 | Roy et al. |
| 5,396,244 | A | 3/1995 | Engel |
| 5,424,735 | A | 6/1995 | Arkas et al. |
| 5,511,003 | A | 4/1996 | Agarwal |
| 5,561,425 | A | 10/1996 | Therssen |
| 5,568,142 | A | 10/1996 | Velazquez et al. |
| 5,761,088 | A | 6/1998 | Hulyalkar et al. |
| 5,815,102 | A | 9/1998 | Melanson |
| 6,081,299 | A | 6/2000 | Kesselring et al. |

(Continued)

FOREIGN PATENT DOCUMENTS

| | | |
|---|---|---|
| WO | WO 2006/102178 | 9/2006 |
| WO | WO 2008/151137 | 12/2008 |

OTHER PUBLICATIONS

Haykin et al. "Nonlinear Adaptive Prediction of Nonstationary Signals", IEEE TSP, vol. 43, No. 2, 1995, pp. 526-535.*

(Continued)

*Primary Examiner* — Li-Wu Chang
(74) *Attorney, Agent, or Firm* — Baker Botts LLP

(57) ABSTRACT

Techniques for reconstructing a signal encoded with a time encoding machine (TEM) using a recurrent neural network including receiving a TEM-encoded signal, processing the TEM-encoded signal, and reconstructing the TEM-encoded signal with a recurrent neural network.

19 Claims, 8 Drawing Sheets

(56) References Cited

U.S. PATENT DOCUMENTS

| | | | |
|---|---|---|---|
| 6,087,968 A | 7/2000 | Roza |
| 6,121,910 A | 9/2000 | Khoury et al. |
| 6,177,893 B1 | 1/2001 | Velazquez et al. |
| 6,177,910 B1 | 1/2001 | Sathoff et al. |
| 6,332,043 B1 | 12/2001 | Ogata |
| 6,369,730 B1 | 4/2002 | Blanken et al. |
| 6,441,764 B1 | 8/2002 | Barron et al. |
| 6,476,749 B1 | 11/2002 | Yeap et al. |
| 6,476,754 B2 | 11/2002 | Lowenborg et al. |
| 6,511,424 B1 | 1/2003 | Moore-Ede et al. |
| 6,515,603 B1 | 2/2003 | McGrath |
| 6,646,581 B1 | 11/2003 | Huang |
| 6,744,825 B1 | 6/2004 | Rimstad et al. |
| 6,961,378 B1 | 11/2005 | Greenfield et al. |
| 7,028,271 B2 | 4/2006 | Matsugi et al. |
| 7,336,210 B2 | 2/2008 | Lazar et al. |
| 7,346,216 B2 | 3/2008 | Adachi et al. |
| 7,479,907 B2 | 1/2009 | Lazar et al. |
| 7,573,956 B2 | 8/2009 | Lazar et al. |
| 7,750,835 B1 | 7/2010 | Albrecht et al. |
| 7,764,716 B2 | 7/2010 | McKnight et al. |
| 7,948,869 B2 | 5/2011 | Peter et al. |
| 7,966,268 B2 | 6/2011 | Anderson et al. |
| 8,023,046 B2 | 9/2011 | Lazar et al. |
| 8,199,041 B2 | 6/2012 | Nakajima |
| 8,223,052 B1 | 7/2012 | Kong et al. |
| 8,314,725 B2 | 11/2012 | Zepeda et al. |
| 8,595,157 B2 | 11/2013 | Albrecht et al. |
| 2001/0044919 A1 | 11/2001 | Edmonston et al. |
| 2004/0071354 A1 | 4/2004 | Adachi et al. |
| 2004/0158472 A1 | 8/2004 | Voessing |
| 2005/0190865 A1 | 9/2005 | Lazar et al. |
| 2005/0252361 A1 | 11/2005 | Oshikiri |
| 2006/0261986 A1 | 11/2006 | Lazar |
| 2009/0141815 A1 | 6/2009 | Peter et al. |
| 2009/0190544 A1 | 7/2009 | Meylan et al. |
| 2010/0138218 A1 | 6/2010 | Geiger |
| 2010/0225824 A1* | 9/2010 | Lazar et al. ................. 348/723 |
| 2010/0303101 A1 | 12/2010 | Lazar et al. |
| 2012/0039399 A1 | 2/2012 | Lazar et al. |
| 2012/0084040 A1 | 4/2012 | Lazar et al. |
| 2012/0310871 A1 | 12/2012 | Albrecht et al. |
| 2012/0317061 A1 | 12/2012 | Lakshminarayan et al. |
| 2013/0311412 A1 | 11/2013 | Lazar et al. |

OTHER PUBLICATIONS

Topi et al. "Spline Recurrent Neural Networks for Quad-Tree Video Coding" Marinaro et al. (Eds.): WIRN VIETRI 2002, LNCS 2486, Springer-Verlag, 2002, pp. 90-98.*
U.S. Appl. No. 11/049,401, Jul. 2, 2009 Issue Fee payment.
U.S. Appl. No. 11/049,401, May 21, 2009 Notice of Allowance.
U.S. Appl. No. 11/049,401, May 11, 2009 Response to Non-Final Office Action.
U.S. Appl. No. 11/049,401, Feb. 12, 2009 Non-Final Office Action.
U.S. Appl. No. 11/049,401, Dec. 22, 2008 Response to Non-Final Office Action.
U.S. Appl. No. 11/049,401, Sep. 24, 2008 Non-Final Office Action.
U.S. Appl. No. 11/049,401, Aug. 7, 2008 Request for Continued Examination (RCE).
U.S. Appl. No. 11/049,401, May 7, 2008 Ex Parte Quayle Action.
U.S. Appl. No. 11/285,457, Dec. 27, 2007 Issue Fee payment.
U.S. Appl. No. 11/285,457, Sep. 28, 2007 Notice of Allowance.
U.S. Appl. No. 11/285,457, Sep. 7, 2007 Response to Final Office Action.
U.S. Appl. No. 11/285,457, May 15, 2007 Final Office Action.
U.S. Appl. No. 11/285,457, Apr. 16, 2007 Response to Non-Final Office Action.
U.S. Appl. No. 11/285,457, Jan. 26, 2007 Non-Final Office Action.
U.S. Appl. No. 11/285,457, Oct. 23, 2006 Response to Non-Final Office Action.
U.S. Appl. No. 11/285,457, Sep. 8, 2009 Non-Final Office Action.
U.S. Appl. No. 11/965,337, Dec. 10, 2008 Issue Fee payment.
U.S. Appl. No. 11/965,337, Nov. 3, 2008 Notice of Allowance.
U.S. Appl. No. 11/965,337, Sep. 3, 2008 Response to Non-Final Office Action.
U.S. Appl. No. 11/965,337, Jun. 3, 2008 Non-Final Office Action.
U.S. Appl. No. 12/645,292, Aug. 17, 2011 Issue Fee payment.
U.S. Appl. No. 12/645,292, May 17, 2011 Notice of Allowance.
U.S. Appl. No. 12/645,292, Apr. 27, 2011 Response to Non-Final Office Action.
U.S. Appl. No. 12/645,292, Jan. 7, 2011 Non-Final Office Action.
U.S. Appl. No. 12/628,067, Aug. 1, 2013 Amendment and Request for Continued Examination (RCE).
U.S. Appl. No. 12/628,067, Mar. 1, 2013 Final Office.
U.S. Appl. No. 12/628,067, Jan. 16, 2013 Response To Non-Final Office Action.
U.S. Appl. No. 12/628,067, Jul. 19, 2012 Non-Final Office Action.
U.S. Appl. No. 12/628,067, Mar. 6, 2012 Response to Non-Final Office Action.
U.S. Appl. No. 12/628,067, Nov. 23, 2011 Non-Final Office Action.
U.S. Appl. No. 13/214,041, Dec. 24, 2013 Non-Final Office Action.
Akay, "Time Frequency and Wavelets in Biomedical signal Processing", *Wiley-IEEE Press*, Table of Contents (1997) Retrieved at http://www.wiley.com/WileyCDA/WileyTitle/productCd-0780311477,miniSiteCd-IEEE2 on Aug. 6, 2008.
Aksenov, et al., "Biomedical Data Acquisition Systems Based on Sigma-Delta Analogue-To Digital converters", *2001 Proceedings of the 23rd Annual EMBS International Conference*, Istanbul, Turkey, 4:3336-3337 (Oct. 25-28, 2001).
Antoine, et al., "Two-Dimensional Wavelets and Their Relatives", *Cambridge University Press*, Table of Contents (2004).
Averbeck, et al., "Neural Correlations, Population Coding and Computation", *Nature*, 7:358-366 (2006).
Balan, et al., "Multiframes and Multi Riesz Bases: I. The General theory and Weyl-Heisenberg Case", *Technical Report, Institute for mathematics and its Applications*, (18 pages) (1997).
Balan, "Multiplexing of Signals using Superframes", *Wavelets Applications in Signal and Image Processing VIII*, 4119:118-130 (2000).
Barr, et al., "Energy Aware Lossless Data Compression", *Proceedings of the 1st International Conference on Mobile Systems, Applications and Services*, San Francisco, CA, pp. 231-244 (2003).
Bjorck, et al., "Solution of Vandermonde Systems of Equations", *Mathematics of Computation*, 24(112):893-903 (1970).
Butts, et al., "Temporal Precision in the Neural code and the Timescales of Natural Vision", *Nature*, 449(7158):92-95 (2007).
Christensen, "Frames, Riesz Bases, and Discrete Gabor/Wavelet Expansions", *American Mathematical Society*, 38(3):273-291 (2001).
Christensen, "An Introduction to Frames and Riesz Bases", *Springer*, Table of Contents (2003) http://www.springer.com/birkhauser/mathematics/books/978-0-8176/4295-2?detailsPage=toc Retrieved on Aug. 6, 2008.
Dayan et al., "Theoretical Neuroscience", *The MIT Press*, Table of Contents (2001) http://mitpress.mit.edu/catalog/item/default.asp?ttyoe=2&tid=8590&mode=toc Retrieved on line Aug. 6, 2008.
Delbruck, "Frame-Free Dynamic Digital Vision", *Proceedings of international Symposium on Secure-Life Electronics, Advanced Electronics for Quality Life and Society, University of Tokyo*, pp. 21-26 (Mar. 6-7, 2008).
Deneve, et al., "Reading Population Codes: A Neural Implementation of Ideal Observers", *Nature Neuroscience*, 2(8):740-745 (1999).
Dods, et al., "Asynchronous Sampling for Optical Performance Monitoring", *Optical fiber Communication Conference*, Anaheim, California (3 pages) (2007).
Eldar, et al., "Sampling with Arbitrary Sampling and Reconstruction Spaces and Oblique dual Frame Vectors", *The Journal of Fourier Analysis and Applications*, 9(1):77-96 (2003).
Eldar, et al., "General Framework for Consistent Sampling in Hilbert Spaces", *International journal of Wavelets, Multiresolution and information Processing*, 3(3):347-359 (2005).
Fain, "Sensory Transduction", *Sinauer Associates, Inc.*, Table of contents (2003) Retrieved http://www.sinauer.com/detail.php?id=1716 on Aug. 6, 2008.

(56) References Cited

OTHER PUBLICATIONS

Feichter, et al., "Theory and Practice of Irregular Sampling", *Wavelets: Mathematics and Applications, CRC Press, Studies in Advanced Mathematics*, pp. 305-363 (1994).

Feichter, et al., "Efficient Numerical Methods in Non-Uniform Sampling Theory", *Numer. Math.*, 69:423-440 (1995).

Feichter, et al., "Improved Locality for Irregular Sampling Algorithms", *2000 International Conference on Acoustic, Speech, and Signal Processing*, Istanbul, Turkey, Table of Contents (Jun. 5-9, 2000).

Field, et al., "Information Processing in the Primate Retina: Circuitry and Coding", *Annual Reviews Neuroscience*, 30(1):1-30 (2007).

Häfliger, et al., "A Rank Encoder: Adaptive Analog to Digital conversion Exploiting Time Domain Spike Signal Processing", *Analog Integrated Circuits and Signal Processing Archive*, 40(1):39-51 (2004).

Han, et al., "Memoirs of the American Mathematical Society: Frames, Baese and Group Presentations", *American Mathematical Society*, 147(697): Table of Contents (2000).

Harris, et al., "Real Time Signal Reconstruction from Spikes on a Digital Signal Processor", *IEEE International Symposium on Circuits and Systems (ISCAS 2008)*, pp. 1060-1063 (2008).

Hudspeth, et al., "Auditory Neuroscience: Development, Transduction, and Integration", *PNAS*, 97(22):11690-11691 (2000).

Jaffard, "A Density Criterion for Frames of Complex Exponentials", *Michigan Math J.*, 38:339-348 (1991).

Jones, et al., "An Evaluation of the Two-Dimensional Gabor Filter Model of Simple Receptive Fields on Cat Striate Cortex", *Journal of Neurophysiology*, 58(6):1233-1258 (1987).

Jovanov, et al., "A Wireless Body Area network of Intelligent motion sensors for computer Assisted Physical Rehabilitation", *Journal of NeuroEngineering and Rehabiliation*, 2:6 (10 pages) (2005).

Kaldy, et al., "Time Encoded Communications for Human Area Network Biomonitoring", *BNET Technical Report #2-7, Department of Electrical Engineering, Columbia University*, (8 pages) (2007).

Keat, et al., "Predicting Every Spike: A Model for the Responses of Visual Neurons", *Neuron*, 30:803-817 (2001).

Kim, et al., "A Comparison of Optimal MIMO Linear and Nonlinear Models for Brain-Machine Interfaces", *Journal of Neural Engineering*, 3:145-161 (2006).

Kinget, et al., "on the Robustness of an Analog VLSI Implementation of a Time Encoding Machine", *IEEE International Symposium on Circuits and Systems*, pp. 4221-4224 (2005).

Kong, et al., "A Time-Encoding Machine Based High-Speed Analog-to-Digital Converter", *IEEE Journal on Emerging and Selected Topics in Circuits and Systems*, 2(3):552-563 (2012).

Kovacevic, et al., "Filter Bank Frame Expansions with Erasures", *IEEE Transactions on Information Theory*, 48(6):1439-1450 (2002).

Krishnapura, et al., "A Baseband Pulse Shaping Filter for Gaussian Minimum Shift Keying", *ISCAS '98, IEEE International Symposium on circuits and Systems*, vol. 1:249-252 (1998).

Lazar, "Time Encoding Machines with Multiplicative Coupling, Feedforward, and Feedback", *Circuits and Systems II: Express Briefs, IEEE Transactions on vol. 53, Issue 8*, Aug. 2006, pp. 672-676.

Lazar, "Time Encoding and Perfect Recovery of Bandlimited Signals", *Acoustics, Speech, and Signal Processing, 2003, Proceedings (ICASSP 2003), 2003 IEEE International Conference on vol. 6*, pp. VI-709-712 vol. 6.

Lazar, et al., "Perfect recovery and sensitivity analysis of time encoded bandlimited signals", *IEEE Transactions on Circuits and Systems*, 51(10): 2060-2073, Oct. 2004.

Lazar, et al., "Real-Time Algorithm for Time Decoding Machines", *EUSIPCO '06* (Sep. 2006).

Lazar, et al., "Encoding, Processing and Decoding of Sensory Stimuli with a Spiking Neural Population", *Research in encoding and Decoding of Neural Ensembles*, Santiori, Greece, (1 page) (Jun. 26-29, 2008).

Lazar, "A Simple Spiking Retina Model for Exact Video Stimulus Representation", *The Computational Neuroscience Meeting, CNS 2008*, Portland, Oregon (1 page) (Jul. 19-24, 2008).

Lazar, et al., "Time Encoding and Time Domain Computing of Video Streams", *Department of Electrical engineering Columbia University*, (20 pages) (Mar. 14, 2008).

Lazar, et al., "A MIMO Time Encoding Machine", submitted for publication Jan. 2008, (28 pages).

Lazar, et al., "Encoding of Multivariate Stimuli with MIMO Neural Circuits", *Proceedings of the IEEE International Symposium on Information Theory*, Saint Petersburg, Russia, (5 pages) (Jul. 31-Aug. 5, 2011).

Lazar, et al., "Video Time Encoding Machines", (Jun. 15, 2008) submitted for publication Oct. 2008, (27 pages).

Lazar, et al., "Channel Identification Machines", *Computational Intelligence and Neuroscience*, 2012:209590 (20 pages) (2012).

Lazar, "Multichannel Time Encoding with Integrate-and-Fire Neurons", *Neurocomputing*, 65-66:401-407 (2005).

Lazar, "Recovery of Stimuli Encoded with Hodgkin-Huxley Neurons", *Computational and Systems Neuroscience Meeting, COSYNE 2007*, Salt Lake City, UT, Feb. 22-25, 2007, *Cosyne Poster III-94*, p. 296.

Lazar, "Time Encoding with an Integrate-and-Fire Neuron with a Refractory Period", *Neurocomputing*, 58-60:53-58 (2004).

Lazar, et al., "Video Time Encoding Machines", *IEEE Transactions on Neural Networks*, 22(3):461-473 (2011).

Lazar, "Population Encoding with Hodgkin-Huxley Neurons", *IEEE Transactions on Information Theory*, 56(2):821-837 (2010).

Lazar, "Information Representation with an Ensemble of Hodgkin-Huxley Neurons", *Neurocomputing*, 70:1764-1771 (2007).

Lazar, et al., "Encoding Natural Scenes with Neural circuits with Random Thresholds", *Vision Research, Special Issue on Mathematical Models of Visual Coding*, 50(22):2200-2212 (2010).

Lazar, "A Simple Model of Spike Processing", *Neurocomputing*, 69:1081-1085 (2006).

Lazar, et al., "Faithful Representation of Stimuli with a Population of Integrate-and-Fire Neurons", *Neural Computers*, 20(11):2715-2744 (2008).

Lazar, et al., "An Overcomplete Stitching Algorithm for Time Decoding Machines", *IEEE Transactions on Circuits and Systems-I*, (11 pages) (2008).

Lazar, et al., "Fast Recovery Algorithms for Time Encoded Bandlimited Signals", *Proceeding of the International Conference on acoustics, Speech and Signal Processing (ICASSP '05)*, Philadelphia, PA, Mar. 19-23, 2005, 4:237-240 (2005).

Lee, "Image Representation using 2D Gabor Wavelets", *IEEE Transactions on Pattern Analysis and Machine Intelligence*, 18(10):959-971 (1996).

Lichtsteiner, et al., "A 128×128 120db 15 µs Latency Asynchromous Temporal Contrast Vision Sensor", *IEEE Journal of solid-State Circuits*, 43(2):566-576 (2008).

Masland, "The Fundamental Plan of the Retina", *Nature Neuroscience*, 4(9):877-886 (2001).

MIT-BIH Arrhythmia Database, http://www.physionet.org/physiobank/database/mitd Retrieved on Aug. 5, 2008 (3 pages).

Olshausen, "Sparse Codes and Spikes", in R.P.N. Rao, B.A. Olshausen and M.S. Lewicki, editors, Probabilistic Models of Perception and Brian Function, *MIT Press*, (15 pages) (2002).

Olshausen, et al., "Sparse Coding with an Overcomplete Basis Set: A Strategy Employed by V1?", *Vision research*, 37(23):3311-3325 (1997).

Ouzounov, et al., "Analysis and Design of High-Performance Asynchronous Sigma-Delta Modulators with a Binary Quantizer", *IEEE Journal of Solid-State Circuits*, 41(3):588-596 (2006).

Papoulis, "Generalized Sampling Expansion", *IEEE Transactions on Circuits and Systems*, CAS-24(11):652-654 (1977).

"Parks-McClellan FIR filter Design" (Java 1.1 version) http://www.dsptutor.freeuk.com/remez/RemezFIRFilterDesign.htlm. Retrieved on Aug. 5, 2008.

Patterson, et al., "Complex Sounds and Auditory Images", *Advances in the biosciences*, 83:429-446 (1992).

(56) References Cited

OTHER PUBLICATIONS

Pillow, et al., "Prediction and Decoding of Retinal Ganglion Cell Responses with a Probabilistic Spiking Model", *The Journal of Neuroscience*, 25(47):11003-11013 (2005).

Roza, "Analog-to-Digital conversion Via Duty-Cycle Modulation", *IEEE Transactions on Circuits and Systems II: Analog and Digital Signal Processing*, 44(11):907-917 (1997).

Sanger, "Neural Population Codes", *Current Opinion in Neurobiology*, 13:238-249 (2003).

Seidner, et al., "Vector Sampling Expansion", *IEEE Transactions on Signal Processing*, 48(5):1401-1416 (2000).

Shang, et al., "Vector Sampling Expansions in shift Invariant Subspaces", *J. Math. Anal. Appl.*, 325:898-919 (2007).

Sheung, "A Continuous-Time Asynchronous Sigma Delta Analog to Digital Converter for Broadband Wireless Receiver with Adaptive Digital Calibration Technique", *PhD Thesis, Department of Electrical and Computer Engineering, Ohio State University*, (137 pages) (2009).

Shinagawa, et al., "A Near-Field-Sensing Transceiver for Intrabody Communication Based on the Electrooptic Effect", *IEEE Transactions on Instrumentation and Measurement*, 53(6):1533-1538 (2004).

Slaney, "Auditory Toolbox", *Technical Report #1998-010, Interval Research Corporation*, (52 pages) (1998).

Strohmer, "Numerical Analysis of the Non-Uniform Sampling Problem", *Journal of Computational and Applied Mathematics*, 122:297-316 (2000).

Strohmer, "Irregular Sampling, Frames and Pseudoinverse", *Master Thesis, dept. Math. Univ.*, Vienna, Austria, (Abstract) (1991), (1 page).

Teolis, "Computational signal Processing with Wavelets", *Applied and Numerical Harmonic Analysis*, Chapter 4-6, pp. 59-167 (1998).

Venkataramani, et al., "Sampling Theorems for Uniform and Periodic Nonuniform MIMO Sampling of Multiband Signals", *IEEE Transactions on Signal Processing*, 51(12):3152-3163 (2003).

Wei, et al., "Signal Reconstruction from Spiking Neuron Models", *Proceedings of the ISCAS '04*, vol. V:353-356 (May 23-26, 2004).

Wolfram, "Mathematic 5.2", The Mathematica Book Online, http://documents.wolfram.com/mathematica Retrieved on Aug. 5, 2008.

Yang, et al., "A Bio-Inspired Ultra-Energy-Efficient Analog-to-Digital converter for Biomedical Applications", *IEEE Transactions on Circuits and Systems-I: Regular Papers*, 53(11):2349-2356 (2006).

Zimmerman, "Personal Area Networks (PAN): Near-field Intra-Body Communication", *MS Thesis, MIT*, (81 pages) (1995).

Zimmerman, "Personal Area Networks: Near-field Intrabody Communication", *IBM systems Journal*, 35(3&4):609-617 (1996).

\* cited by examiner

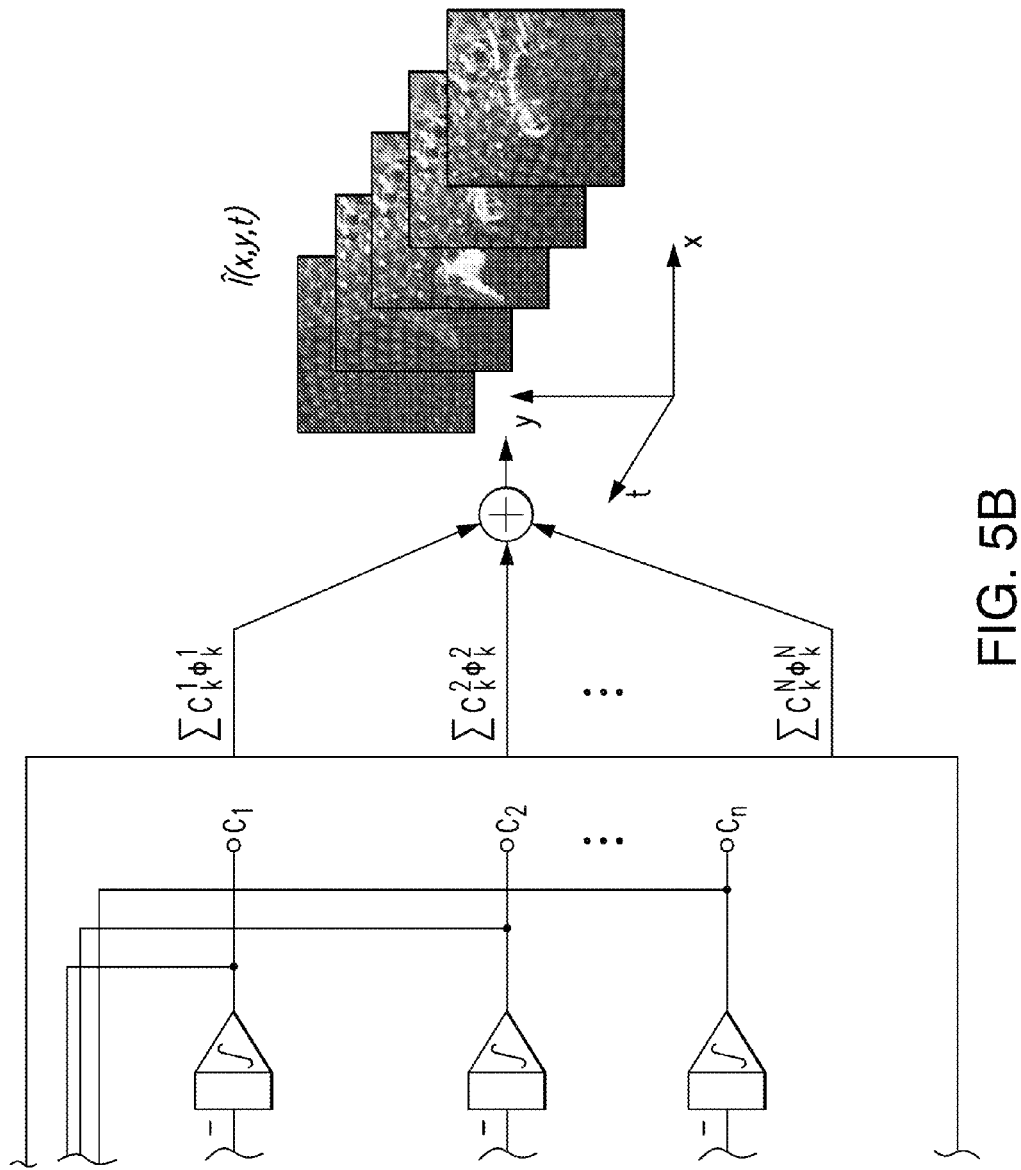

US 8,874,496 B2

ENCODING AND DECODING MACHINE WITH RECURRENT NEURAL NETWORKS

CROSS-REFERENCE TO RELATED APPLICATIONS

This application is a continuation of International Application Serial No. PCT/US2012/024413, filed Feb. 9, 2012 which claims priority to U.S. Provisional Application Ser. No. 61/441,203, filed Feb. 9, 2011, each of which is hereby incorporated by reference in it's entirety.

STATEMENT REGARDING FEDERALLY SPONSORED RESEARCH OR DEVELOPMENT

This invention was made with government support under grants FA9550-01-1-0350, awarded by USAR/AFOSR, CNS 0855217, awarded by the National Science Foundation, and CNS 0958379, awarded by the National Science Foundation. The government has certain rights in the invention.

BACKGROUND

The presently disclosed subject matter relates to methods and systems for the encoding and reconstruction of signals encoded with time encoding machines (TEM), and more particularly to the reconstruction of signals encoded with TEMs with the use of recurrent neural networks.

Most signals in the natural world are analog, i.e., they cover a continuous range of amplitude values. However, most computer systems for processing these signals are binary digital systems. Synchronous analog-to-digital (A/D) converters can be used to capture analog signals and present a digital approximation of the input signal to a computer processor. That is, at certain moments in time synchronized to a system clock, the amplitude of the signal of interest is captured as a digital value. When sampling the amplitude of an analog signal, each bit in the digital representation of the signal represents an increment of voltage, which defines the resolution of the A/D converter. Analog-to-digital conversion is used in many applications, such as communications where a signal to be communicated can be converted from an analog signal, such as voice, to a digital signal prior to transport along a transmission line.

Applying traditional sampling theory, a band limited signal can be represented with a quantifiable error by sampling the analog signal at a sampling rate at or above what is commonly referred to as the Nyquist sampling rate. It is a trend in electronic circuit design to reduce the available operating voltage provided to integrated circuit devices. In this regard, power supply voltages for circuits are generally decreasing. While digital signals can be processed at the lower supply voltages, traditional synchronous sampling of the amplitude of a signal becomes more difficult as the available power supply voltage is reduced and each bit in the A/D or D/A converter reflects a substantially lower voltage increment.

Time Encoding Machines (TEMs) can encode analog information in the time domain using only asynchronous circuits. Representation in the time domain can be an alternative to the classical sampling representation in the amplitude domain. Applications for TEMs can be found in low power nano-sensors for analog-to-discrete (A/D) conversion as well as in modeling olfactory systems, vision and audition in neuroscience.

SUMMARY

Methods and systems for reconstructing TEM-encoded signals using recurrent neural networks are disclosed herein.

According to some embodiments of the disclosed subject matter, methods for reconstructing a signal encoded with a time encoding machine (TEM) using a recurrent neural network include first receiving a TEM-encoded signal and processing it for input into a recurrent neural network. The original signal is then reconstructed using the recurrent neural network.

In one embodiment, the reconstruction process includes formulating the reconstruction into a variational problem having a solution equal to a summation of a series of functions multiplied by a series of coefficients. The coefficients can be obtain by solving an optimization problem. The optimization problem can be solved by a recurrent neural network whose architecture can be defined according to a particular differential equation. The original analog signal can then be reconstructed using the coefficients.

In another embodiment, the TEM-encoded signal can be Video Time Encoding Machine (vTEM) encoded signals. The method of reconstructing using a recurrent neural network can have a plurality of inputs for a plurality of signals generated by the vTEM.

According to some embodiments of the disclosed subject matter, systems for reconstructing a signal encoded with a TEM using a recurrent neural network include at least one input for receiving a TEM-encoded signal. The input can then pass a signal along an arrangement of adders, integrators, multipliers, and/or piecewise linear activators arranged to reflect a recurrent neural network defined by a particular differential equation. The system can have a plurality of outputs for providing at least one coefficient representing a reconstructed signal.

In some embodiments, the recurrent neural network can include three layers. The first layer can consist of a plurality of multiply/add units. Each of the nodes in the first layer can be operatively connected to a second layer which also includes a plurality of multiply/add units. The third layer, also consisting of a plurality of multiply/add units can calculate a gradient weighted by a learning rate and can output the time derivative of the coefficient. The outputs can then be integrated and fed back into the first layer.

BRIEF DESCRIPTION OF THE DRAWINGS

FIG. 5A-FIG. 5B is schematic diagram of a recurrent neural network according to another embodiment the disclosed subject matter for reconstructing vTEM encoded signals.

DETAILED DESCRIPTION

Figure 1:
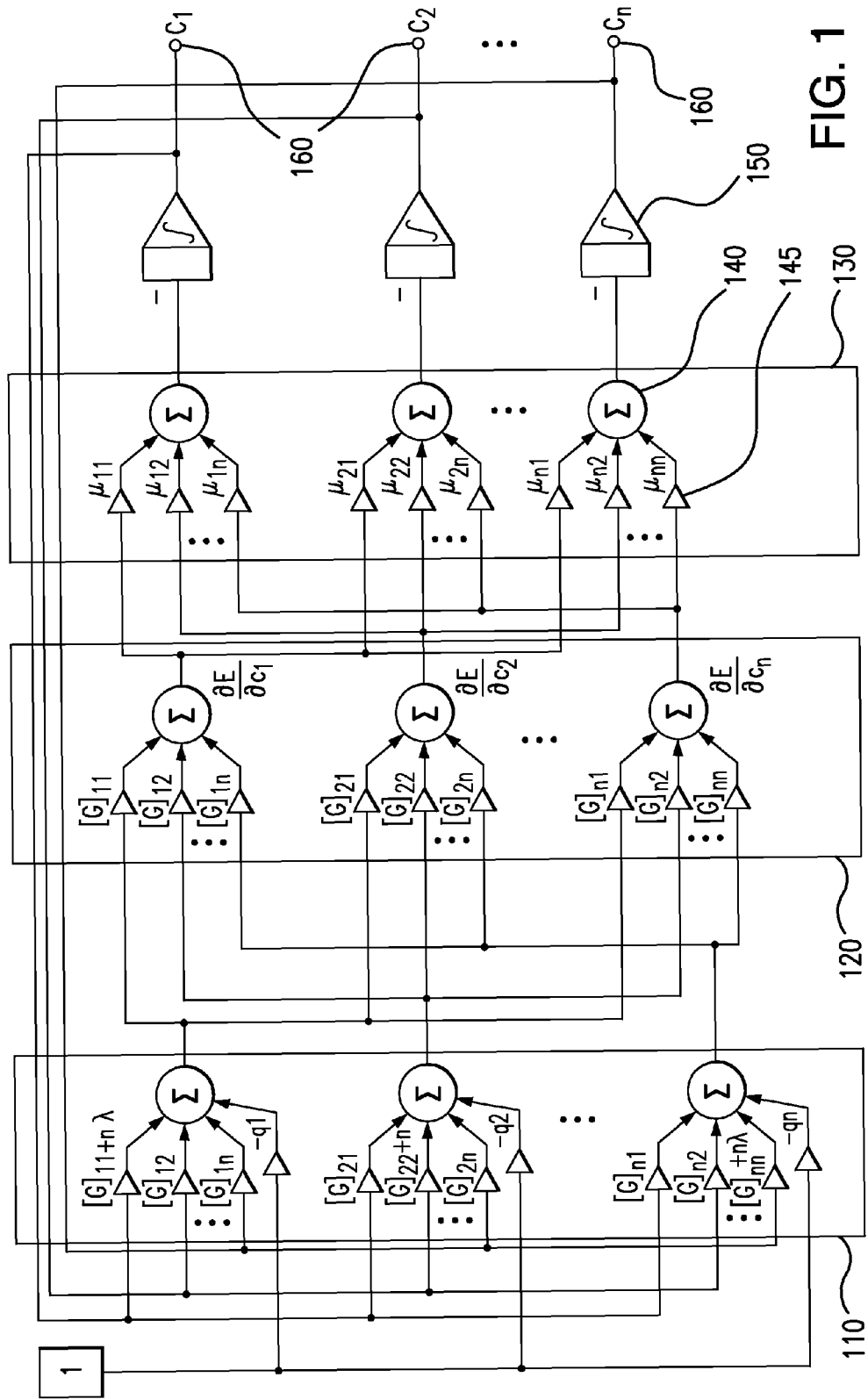
FIG. 1 is a schematic diagram of a recurrent neural network for reconstructing a TEM-encoded signal according to one embodiment of the disclosed subject matter.

The presently disclosed subject matter provides techniques for encoding and decoding an analog signal into the time domain, also referred to as the spike domain. More particularly, the presently disclosed subject matter provides for the use of recurrent neural networks in encoding and decoding analog signals into and from the time domain and the encoding and decoding of visual stimuli with recurrent neural networks.

The present application makes use of time encoding, a time encoding machine (TEM) and a time decoding machine (TDM). Time encoding is a real-time asynchronous mechanism of mapping the amplitude of a bandlimited signal u=u (t), t∈ℝ, into a strictly increasing time sequence $(t_k)$, k∈ℤ, where ℝ and ℤ denote the sets of real numbers and integers, respectively. It should be noted that throughout this specification the symbol ℜ should be construed in the same manner as the symbol ℝ, to mean the set of real numbers A Time Encoding Machine (TEM) is the realization of an asynchronous time encoding mechanism. A Time Decoding Machine (TDM) is the realization of an algorithm for signal recovery. With increasing device speeds TEMs are able to better leverage a temporal model of encoding a signal. The interest in temporal encoding in neuroscience is closely linked with the natural representation of sensory stimuli (signals) as a sequence of action potentials (spikes). Spikes can be discrete time events that carry information about stimuli.

Time Encoding Machines (TEMs) model the representation (encoding) of stimuli by sensory systems with neural circuits that communicate via spikes (action potentials). TEMs asynchronously encode time-varying analog stimuli into a multidimensional time sequence. TEMs can also be implemented in hardware. For example Asynchronous Sigma-Delta Modulators (ASDMs), that have been shown to be an instance of TEMs, can be robustly implemented in low power analog VLSI. With the ever decreasing voltage and increasing clock rate, amplitude domain high precision quantizers are more and more difficult to implement. Representing information in time domain follows the miniaturization trends of nanotechnology and demonstrates its potential as next generation silicon based signal encoders.

Asynchronous Sigma/Delta modulators as well as FM modulators can encode information in the time domain as described in "Perfect Recovery and Sensitivity Analysis of Time Encoded Bandlimited Signals" by A. A. Lazar and L. T. Toth (*IEEE Transactions on Circuits and Systems-I: Regular Papers,* 51(10):2060-2073, October 2004), which is incorporated by reference. More general TEMs with multiplicative coupling, feedforward and feedback have also been characterized by A. A. Lazar in "Time Encoding Machines with Multiplicative Coupling, Feedback and Feedforward" (*IEEE Transactions on Circuits and Systems II: Express Briefs,* 53(8):672-676, August 2006), which is incorporated by reference. TEMs realized as single and as a population of integrate-and-fire neurons are described by A. A. Lazar in "Multichannel Time Encoding with Integrate-and-Fire Neurons" (*Neurocomputing,* 65-66:401-407, 2005) and "Information Representation with an Ensemble of Hodgkin-Huxley Neurons" (*Neurocomputing,* 70:1764-1771, June 2007), both of which are incorporated by reference. Single-input multiple-output (SIMO) TEMs are described in "Faithful Representation of Stimuli with a Population of Integrate-and-Fire Neurons" by A. A. Lazar and E. A. Pnevmatikakis (*Neural Computation*), which is incorporated by reference.

Disclosed herein are methods and systems of reconstructing a signal encoded with a time encoding machine (TEM) using a recurrent neural network. Examples will now be given showing exemplary embodiments of the disclosed subject matter. First, a method and system are provided for reconstruction of a TEM-encoded signal encoded with a single-input single-output TEM. For purposes of illustration and not limitation, a model of the signal and an overview of the encoding process are provided. One of ordinary skill will appreciate that other suitable models and encoding processes can be used in accordance with the subject matter disclosed herein. Next, the methods and systems for reconstruction of a single-input single-output TEM-encoded signal will be expanded to reconstruction of multi-dimensional signals, for example the reconstruction of space-time stimuli encoded with Video Time Encoding Machines (vTEMs). For purposes of illustration, the exemplary model of the single-input single-output signal is extended to the space-time vTEM encoded signal. An overview of vTEM encoding will also be provided. One of ordinary skill will appreciate that a variety of other suitable models and encoding processes can be used, and that the examples provided herein are not for purposes of limitation. For example, the presently disclosed subject matter can reconstruct olfactory or auditory stimuli as well as visual stimuli.

Single-Input Single-Output Tem Encoded Signals

In the case of a single-input single-output TEM that encodes time-varying signals, time-varying stimuli (signals) can be elements of a space of trigonometric polynomials. For example, in Hilbert space $\mathcal{H}$, every element u=u(t), t∈ℝ is of the form $$u(t) = \sum_{m_t=-M_t}^{M_t} c_{m_t} e_{m_t},$$

with $$e_{m_t} = \exp\left(jm_t \frac{\Omega_t}{M_t} t\right)$$

an element of the basis spanning the space $\mathcal{H}_t$; $\Omega_t$ and $M_t$ are the bandwidth and the order of the space of trigonometric polynomials, respectively. Every element in this Hilbert space is periodic with period $$S_t = \frac{2\pi M_t}{\Omega_t}.$$

Assuming that all signals are real, $c_{-m_t} = \overline{c_{m_t}}$, where $\overline{(\cdot)}$ denotes the complex conjugate.

The inner product in $\mathcal{H}_t$ can be defined in the usual way: $\forall u, v \in \mathcal{H}_t,$ $$\langle u, v \rangle = \frac{1}{S_t} \int_0^{S_t} u(t) \overline{v(t)} dt.$$

The space of trigonometric polynomials can be a finite dimensional Hilbert space, and therefore, a Reproducing Kernel Hilbert Space (RKHS), with reproducing kernel $$K(t, s) = \sum_{m_t=-M_t}^{M_t} e_{m_t}(t-s),$$

with $t, s \in \mathbb{R}$.

Modeling the set of stimuli in a Hilbert space can enable the use of geometry of the space to reduce stimulus encoding to projections on a set of functions.

Encoding of a time-varying signal, for example, with a TEM, can consist of two cascaded modules. The signal can be passed through a temporal receptive field $D_T(t)$ before being fed into a neural circuit. The processing of the temporal receptive field can be modeled as filtering. For example, an operator ${}^T L: \mathcal{H}_t \to \mathcal{H}_t$ can be defined such that $$v(t) = {}^T L u = \int_{\mathbb{R}} D_T(t-s) u(s) ds = (D_T * u)(t).$$

The neural circuit can encode the output of the receptive field. The neural circuit can be realized with different neural models. For example, the neural circuit can be an Integrate-And-Fire (IAF) neuron, a Hodgkin-Huxley neuron, an Asynchronous Sigma-Delta Modulator (ASDM), or other suitable model. Spike times of a spike train at the output of the neural circuit can be modeled as $(t_k)$, $k=0, 1, 2, \ldots, n$.

The operation of the neural circuit can be described by a bounded linear functional ${}^T L_k: \mathcal{H}_t \to \mathbb{R}$. The explicit formula of this functional can be determined by the t-transform of the neuron, given by ${}^T L_k u = q_k$, for $u = \in \mathcal{H}_t$, where ${}^T L_k$ and $q_k$ usually depend on $(t_k)$, $k=0, 1, 2, \ldots, n$. For example, for an ideal IAF neuron with the t-transform given by $\int_{t_k}^{t_{k+1}} u(s) ds = \kappa \delta - b(t_{k+1} - t_k)$, leads to ${}^T L_k u = \int_{t_k}^{t_{k+1}} u(s) ds$, $q_k = \kappa \delta - b(t_{k+1} - t_k)$, where $\kappa$, $\delta$ and $b$ are, respectively, the integration constant, the threshold and the bias of the IAF neuron.

Combining the two cascaded modules together, bounded linear functionals $L_k: \mathcal{H}_t \to \mathfrak{R}$ can be defined as $L_k = {}^T L_k {}^T L$ so that $L_k u = {}^T L_k {}^T L u = q_k$. By the Riesz representation theorem, these functionals can be expressed in inner product form as $L_k u = \langle u, \phi_k \rangle$, for all $u \in \mathcal{H}$ where, by the reproducing property, $\phi_k(t) = \langle \phi_k, K_t \rangle = L_k \overline{K_t}$, with $K_t(s) = K(t,s)$.

Because the inner products are merely projections of the time-varying stimulus onto the axes defined by the $\phi_k$'s, encoding can be interpreted as generalized sampling, and the $q_k$'s are measurements given by sampling the signal. Unlike traditional sampling, the sampling functions in time encoding are signal dependent.

In one aspect of the disclosed subject matter, signals encoded with a time encoding machine (TEM) can be reconstructed using a recurrent neural network. In some embodiments, the recurrent neural network can decode a TEM-encoded signal that has been encoded by a single-input single-output TEM as described above. Reference will now be made to particular embodiments of the disclosed subject matter for reconstructing a TEM-encoded signal with a recurrent neural network for purposes of illustration. However, one of ordinary skill will recognize that other suitable variations exist, and thus the following discussion is not intended to be limiting.

Reconstruction of a time-varying signal u from a TEM-encoded signal can be formulated as a variational problem. In one embodiment, the reconstruction is formulated into the variational problem $$\hat{u} = \underset{u \in \mathcal{H}}{\operatorname{argmin}} \left\{ \sum_{k=1}^{n} (\langle u, \phi_k \rangle - q_k)^2 + n\lambda \|u\|_{\mathcal{H}}^2 \right\},$$

where $\lambda$ is a smoothing parameter. By the Representer Theorem, the solution to this problem takes the form $$\hat{u} = \sum_{k=1}^{n} c_k \phi_k.$$

Substituting the solution into the problem, the coefficients $c_k$ can be obtained by solving the unconstrained optimization problem minimize $\|Gc - q\|_{1/2}^2 + n\lambda c^T G c$, where $c = [c_1, c_2, \ldots, c_n]^T$, $q = [q_1, q_2, \ldots, q_n]^T$, I is the n×n identity matrix and G is a symmetric matrix with entries $$[G]_{k,l} = \langle \phi_k, \phi_l \rangle = \sum_{m_t=-M_t}^{M_t} \left( \int_{t_k}^{t_{k+1}} (D_T * e_{-m_t})(s) ds \cdot \int_{t_l}^{t_{l+1}} (D_T * e_{m_t})(s) ds \right).$$

This minimization problem has an explicit analytical solution with c the solution of the system of linear equations $G^T(G + n\lambda I)c = G^T q$. Therefore, reconstruction of a time-varying signal can be accomplished by solving a system of linear equations.

This system of linear equations can be solved by, particularly in the case where the matrix G is a singular matrix, taking the Moore-Penrose pseudo-inverse (hereinafter, "pseudo-inverse"). However, the calculating the Moore-Pensore pseudo-inverse is typically computationally intensive. For example, one conventional algorithm for evaluating the pseudo-inverse is based on singular value decomposition (SVD). SVD is particularly computationally demanding. Recurrent neural networks can be used to efficiently solve optimization problems. These networks can have structures that can be easily implemented in analog VLSI.

In one embodiment, a recurrent neural network can be used to solve the system of linear equations. For example, using a general gradient approach for solving the unconstrained optimization problem minimize $\|Gc - q\|_{1/2}^2 + n\lambda c^T G c$, a set of differential equations can be considered:

$$\frac{dc}{dt} = -\mu \nabla E(c),$$

with initial condition $c(0) = 0$, where $E(c) = \frac{1}{2}(\|Gc - q\|_{1/2}^2 + n\lambda c^T G c)$, and $\mu(c, t)$ is a n×n symmetric positive definite matrix that determines the speed of convergence and whose entries are usually dependent on the variables $c(t)$ and time t, define the architecture of the recurrent neural network. It follows that $\nabla E(c) = G^T((G + n\lambda I)c - q)$. Because $E(c)$ is convex in c, the system of differential equations asymptotically approaches the unique solution of the regularized optimization problem minimize $\|Gc - q\|_{1/2}^2 + n\lambda c^T G c$. Consequently, $$\frac{dc}{dt} = -\mu G^T((G + n\lambda I)c - q).$$

The set of differential equations can be mapped into a recurrent neural network, for example as depicted in FIG. 1. In one embodiment, the network can be a three layer neural network. In the first layer 110, consisting of a plurality (n) of multiply/add units, the vector $(G+n\lambda J)c-q$ can be computed. The multiplication factors can be the entries of the matrix $G+n\lambda I$ and the vector q. In the second layer 120, $\nabla E(c)$ can be evaluated. The second layer 120 can also comprise n multiply/add units, with the multiplication factors provided by the entries of the matrix G. In the third layer 130, the gradient is weighted by the learning rate μ. The third layer 130 can also consist of n multiply/add units 140 and 145. The outputs of the third layer can provide the time derivative of the vector c(t). The time derivatives can then be integrated with integrator 150, providing the outputs 160 of the recurrent neural network, and the outputs can be fed back to the first layer.

Alternatively, in another embodiment, the reconstruction of the TEM-encoded signal can be formulated as the spline interpolation problem $$\hat{u} = \underset{u \in \mathcal{H}, \{\mathcal{L}_k u = q_k\}_{k=1}^n}{\operatorname{argmin}} \{\|u\|_{\mathcal{H}}^2\},$$

that seeks to minimize the norm as well as satisfy all the t-transform equations. This problem can also have a solution that takes the form $$\hat{u} = \sum_{k=1}^{n} c_k \phi_k.$$

Substituting the solution into the interpolation problem, the vector of coefficients c are the solution of the optimization problem $$\text{minimize } \frac{1}{2} c^T G c$$
$$\text{subject to } Gc = q,$$

where $c=[c_1, c_2, \ldots, c_n]^T$, $q=[q_1, q_2, \ldots, q_n]^T$, and G is a symmetric matrix with entries $$[G]_{k,l} = \langle \phi_k, \phi_l \rangle = \sum_{m_t = -M_t}^{M_t} \left( \int_k^{k+1} (D_T * e_{-m})(s) ds \cdot \int_l^{l+1} (D_T * c_m)(s) ds \right).$$

Due to the RKHS property, G is a positive semidefinite matrix. Therefore, the optimization problem is a convex quadratic programming problem with equality constraints.

The optimization problem can be reformulated as a standard quadratic programming problem. By setting $x=[x_+^T x_-^T]^T$ and imposing $x_+\geq 0$, $x_-\geq 0$ such that $c=x_+-x_-$, the convex programming problem $$\text{minimize } \frac{1}{2} x^T Q x$$
$$\text{subject to } Ax = q, x \geq 0$$

is obtained, where $$Q = \begin{bmatrix} G & -G \\ -G & G \end{bmatrix},$$

and $A=[G-G]$.

Figure 2A:
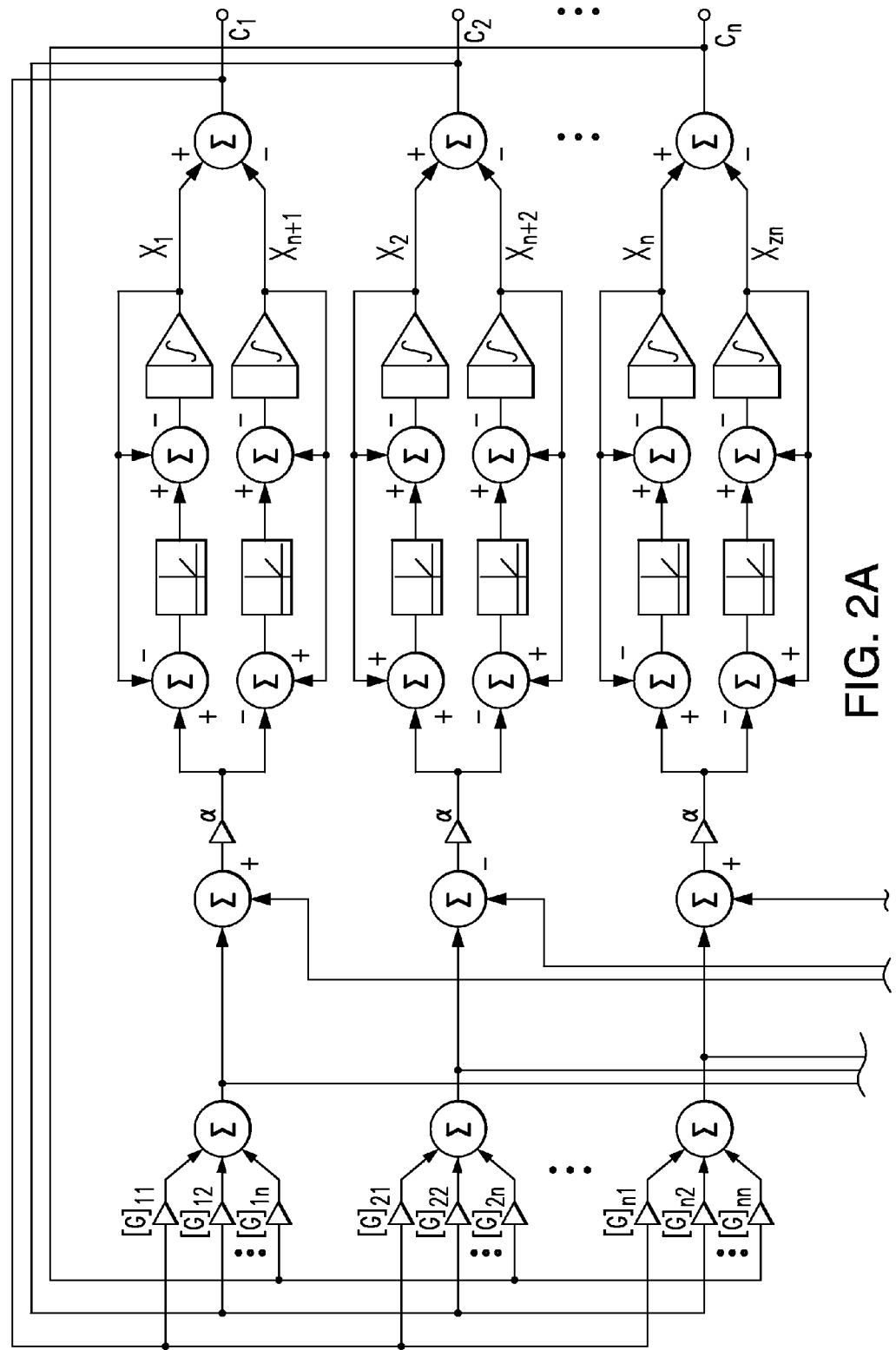
FIG. 2A-FIG. 2B is a schematic diagram of a recurrent neural network for reconstructing a TEM-encoded signal according to another embodiment of the disclosed subject matter.
Figure 2B:
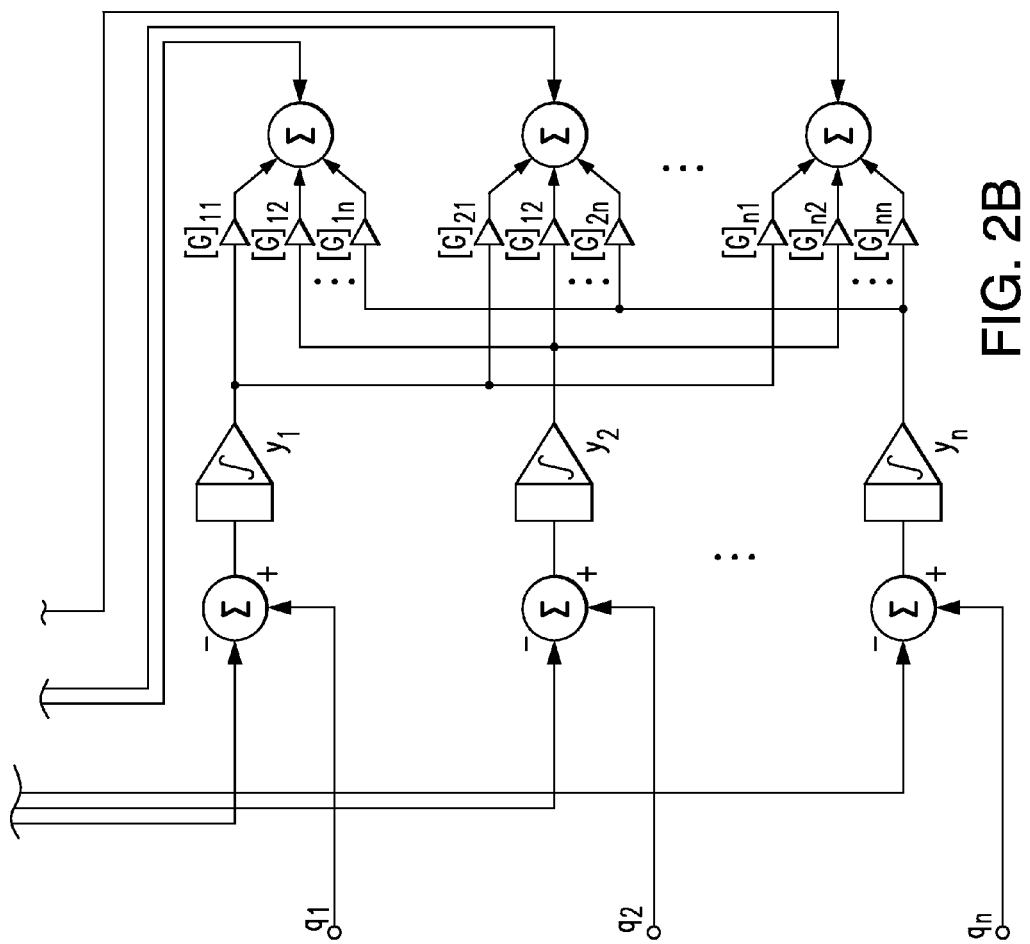

A recurrent network can be constructed that solves the convex programming problem, given by the differential equation $$\frac{d}{dt} \begin{pmatrix} x \\ y \end{pmatrix} = \beta \begin{pmatrix} (x - \alpha Q x + \alpha A^T y)^+ - x \\ \alpha(-Ax + q) \end{pmatrix},$$

where $(x)^+ = [(x_1)^+, \ldots, (x_n)^+]^T$ and $(x_i)^+ = \max\{0, x_i\}$, α is a positive constant and β>0 is the scaling constant. In one embodiment, this network can be a neural network depicted in FIG. 2A-FIG. 2B, where β=1. It should be noted that $Qx=[(Gc)^T-(Gc)^T]^T$, $A^Ty=[(Gy)^T-(Gy)^T]^T$ and $Ax=Gc$, allowing for the circuit diagram in FIG. 2A-FIG. 2B to be simplified.

In various embodiments, the recurrent neural networks, including those described above, can be realized with adders, integrators, multipliers and piecewise linear activation functions. The recurrent neural networks disclosed herein can be highly parallel, and thus can solve large scale problems in real-time implemented in analog VLSI.

vTEM Encoded Signals

Just like in the case of single-dimension single-input single-out TEM-encoded signals, visual signals can be modeled as elements of the vector space of tri-variable trigonometric polynomials, denoted by $\mathcal{H}$. Each element $I \in \mathcal{H}$ is of the form $$I(x, y, t) = \sum_{m_x=-M_x}^{M_x} \sum_{m_y=-M_y}^{M_y} \sum_{m_t=-M_t}^{M_t} c_{m_x,m_y,m_t} e_{m_x,m_y,m_t},$$

where $c_{m_x,m_y,m_t} \in \mathbb{R}$ are constants and $$e_{m_x,m_y,m_t}(x, y, t) =$$
$$e_{m_x}(x) e_{m_y}(y) e_{m_t}(t) = \exp\left( j m_x \frac{\Omega_x}{M_x} x + j m_y \frac{\Omega_y}{M_y} y + j m_t \frac{\Omega_t}{M_t} \right),$$
$$m_x = -M_x, \ldots, M_x,$$

$m_y=-M_y, \ldots, M_y$, $m_t=-M_t, \ldots, M_t$, constitute a basis of $\mathcal{H}$ and $(x, y, t) \in \mathbb{R}^3$. $(\Omega_x, \Omega_y, \Omega_t)$ and $(M_x, M_y, M_t)$ are, respectively, the bandwidth and the order of the trigonometric polynomials in each variable. An element $I \in \mathcal{H}$ is also, respectively, periodic in each variable with period $$S_x = \frac{2\pi M_x}{\Omega_x}, S_y = \frac{2\pi M_y}{\Omega_y}, S_t = \frac{2\pi M_t}{\Omega_t}.$$

The inner product can be defined $\forall I_1, I_2 \in \mathcal{H}$ as, $$\langle I_1, I_2 \rangle = \frac{1}{S_x S_y S_t} \int_0^{S_x} \int_0^{S_y} \int_0^{S_t} I_1(x, y, t) I_2(x, y, t) dx dy dt.$$

By defining the inner product as such, the space of trigonometric polynomials is a Hilbert space. Since $\mathcal{H}$ is finite dimensional it is also a RKHS with reproducing kernel $$K(x, y, t; x', y', t') = \sum_{m_x=-M_x}^{M_x} \sum_{m_y=-M_y}^{M_y} \sum_{m_t=-M_t}^{M_t} e_{m_x, m_y, m_t}(x-x', y-y', t-t').$$

Figure 3:
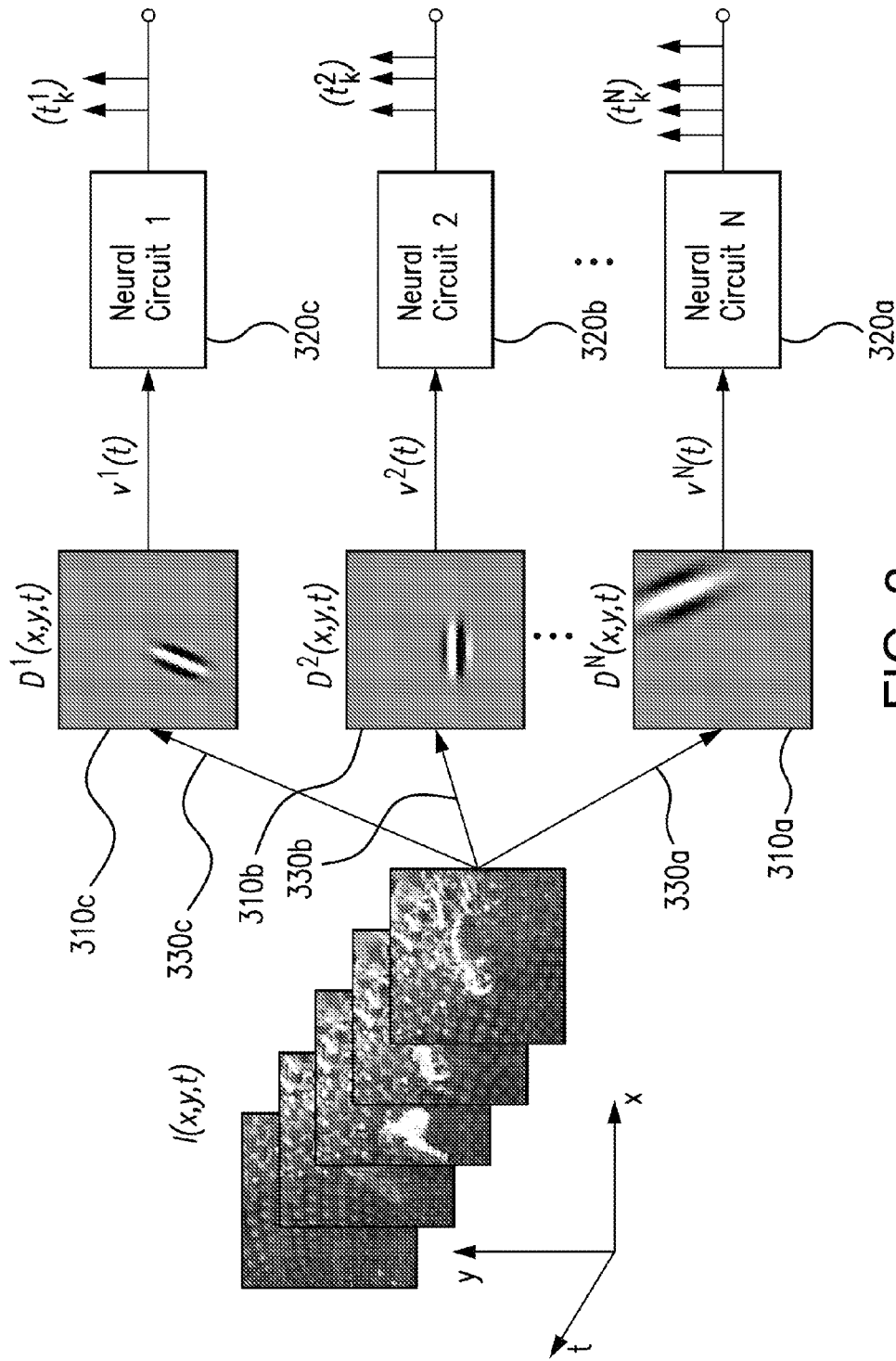
FIG. 3 is a schematic diagram of a Video Time Encoding Machine (vTEM).

Video Time Encoding Machines (vTEMs) encode space-time signals into the spike domain. FIG. 3 depicts a diagram of a typical vTEM. A typical vTEM can comprise a plurality of receptive fields 310 and a population of neurons 320. For example, a vTEM can consist of a plurality of branches 330, each consisting of two modules in cascade: a visual receptive field 310a and a neural circuit 320a consisting of, for example an IAF neuron.

The receptive fields can be considered as spatio-temporal linear filters that preprocess the visual signals and feed them into the IAF neurons. The operation of the jth visual receptive field $D^j(x,y,t)$ can be given by the operator $^S L^j : \mathcal{H} \to \mathcal{H}_t$ by $^S L^j I = \int_{\mathbb{R}} (\int_{\mathbb{R}^2} D^j(x,y,s) I(x,y,t-s) dx dy) ds$. $\mathcal{H}_t$ denotes the univariable trigonometric polynomial space with bandwidth $\Omega_t$ and order $M_t$. The operator maps a 3-D space into a 1-D space.

A simplified case of the visual receptive field, where the field is spatio-temporally separable, can be considered. In this case, the receptive fields can be separated into spatial receptive field $D_s^j(x, y)$ and temporal receptive field $D_T^j(t)$ such that $D^j(x, y, t) = D_s^j(x,y) D_T^j(t)$. The spatial receptive fields can be, for example, Gabor receptive fields or Difference of Gaussian receptive fields. Each spatial receptive field can be derived from a mother wavelet. For example, given the mother wavelet $\gamma(x, y)$, the set of all receptive fields can be obtained by performing the following three operations on their combinations: Dilation $D_\alpha$, $\alpha \in \mathcal{R}_+$:

$$D_\alpha \gamma(x, y) = |\alpha|^{-1} \gamma\left(\frac{x}{\alpha}, \frac{y}{\alpha}\right),$$

Rotation $R_\theta$, $\theta \in [0, 2\pi)$: $R_\theta \gamma(x, y) = \gamma(x \cos \theta + y \sin \theta, -x \sin \theta + y \cos \theta)$, and Translation $T_{x_0, y_0}$, $(x_0, y_0) \in \mathbb{R}^2$: $T_{(x_0, y_0)} \gamma(x, y) = \gamma(x - x_0, y - y_0)$. The receptive fields can form a frame and cover the entire spatial field of a visual signal.

Each output of the visual receptive fields can then be fed into a neural circuit. The output of the jth neural circuit can be denoted $(t_k^j)$, $k = 1, 2, \ldots, n_j$, and the operation of the neural circuit can be described by a bounded linear functional $^T L_k^j : \mathcal{H}_t \to \mathbb{R}$, where $^T L_k^j u = q_k^j$; for $u \in \mathcal{H}_t$.

Combining the two cascaded modules together and assuming a total of N visual receptive fields, the jth of which is connected to the jth neural circuit that generates one spike train $(t_k^j)$, $k = 1, 2, \ldots, n_j$, $j = 1, 2, \ldots, N$, bounded linear functionals $^T L_k^j : \mathcal{H}_t \to \mathcal{R}$ can be defined as $L_k^j = {}^T L_k^j {}^S L^j$ so that $L_k^j I = {}^T L_k^j {}^S L^j I = \langle I, \phi_k^j \rangle = q_k^j$, where $\phi_k^j(x, y, t) = \langle \phi_k^j, K_{x,y,t} \rangle = L_k^j \overline{K_{x,y,t}}$, with $K_{x,y,t}(x',y',t') = K(x,y,t;x', y',t')$. Thus, as in the case of single-input single-output TEM, the operation of the vTEMs can be reduced to generalized sampling for functionals in $\mathcal{H}$.

In one aspect of the disclosed subject matter, signals encoded with a video time encoding machine (vTEM) can be reconstructed using a recurrent neural network. For purposes of illustration, reference will now be made to particular embodiments of the disclosed subject matter for reconstructing a vTEM-encoded signal with a recurrent neural network. However, one of ordinary skill will recognize that other suitable variations exist, and thus the following discussion is not intended to be limiting.

As in the case of single-input single-output TEMs, the output strike trains of vTEMs can be used for reconstruction of the video signal. In one embodiment, the notion of the single-input single-output case can be adapted and reconstruction can again be formulated as a variational problem of the form $$\hat{I} = \arg\min_{I \in \mathcal{H}} \left\{ \sum_{j=1}^{N} \sum_{k=1}^{n_j} (\langle I, \phi_k^j \rangle - q_k^j)^2 + n\lambda \|I\|_\mathcal{H}^2 \right\},$$

where $\lambda$ is the smoothing parameter and $n = \sum_{j=1}^{N} n_j$ is the total number of spikes. The solution to the variational problem can take the form $$\hat{I} = \sum_{j=1}^{N} \sum_{k=1}^{n_j} c_k^j \phi_k^j,$$

where $c = [c_1^1, c_2^1, \ldots, c_{n_1}^1, c_1^2, c_2^2, \ldots, c_{n_2}^2, \ldots, c_{n_N}^N]^T$ satisfies the system of linear equations $G^T(G + n\lambda I)c = G^T q$ with $q = [q_1^1, q_2^1, \ldots, q_{n_1}^1, q_1^2, q_2^2, \ldots, q_{n_2}^2, \ldots, q_{n_N}^N]^T$, I the $n \times n$ identity matrix and G the block matrix $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

with entries of each block given by $[G^{ij}]_{kl} = \langle \phi_k^i, \phi_l^j \rangle$. Thus, again the reconstruction problem reduces to solving a system of linear equations.

In one embodiment, a recurrent neural network can be defined, similar to the case of a single-input single-output TEM-encoded signal, by $$\frac{dc}{dt} = -\mu \nabla E(c),$$

with $c = [c_1^1, c_2^1, \ldots, c_{n_1}^1, c_1^2, c_2^2, \ldots, c_{n_2}^2, \ldots, c_{n_N}^N]^T$, $q = [q_1^1, q_2^1, \ldots, q_{n_1}^1, q_1^2, q_2^2, \ldots, q_{n_2}^2, \ldots, q_{n_N}^N]^T$, and $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

with entries of each block given by $[G^{ij}]_{kl} = \langle \phi_k^i, \phi_l^j \rangle$.

In another embodiment, and again expanding the single-input single-output TEM case, the reconstruction can be formed as a spline interpolation problem $$\hat{I} = \operatorname*{argmin}_{I \in \mathcal{H}, \{\mathcal{L}_k^j I = q_k^j\}_{(k,j)=(1,1)}^{(n,N)}} \{\|I\|_{\mathcal{H}}^2\}.$$

The solution can take the form $$\hat{I} = \sum_{j=1}^{N} \sum_{k=1}^{n_j} c_k^j \phi_k^j,$$

and vector c is the solution to the optimization problem $$\text{minimize } \frac{1}{2} c^T G c$$
$$\text{subject to } Gc = q,$$

where $c=[c_1^1, c_2^1, \ldots, c_{n_1}^1, c_1^2, c_2^2, \ldots, c_{n_2}^2, \ldots, c_{n_N}^N]^T$ satisfies the system of linear equations $G^T(G+n\lambda I)c=G^T q$ with $q=[q_1^1, q_2^1, \ldots, q_{n_1}^1, q_1^2, q_2^2, \ldots, q_{n_2}^2, \ldots, q_{n_N}^N]^T$, I the n×n identity matrix and G the block matrix $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

with entries of each block given by $[G^{ij}]_{kl} = \langle \phi_k^i, \phi_l^j \rangle$.

In one embodiment, a recurrent neural network can be defined, similar to the case of a single-input single-output TEM-encoded signal, by $$\frac{d}{dt}\begin{pmatrix} x \\ y \end{pmatrix} = \beta \begin{pmatrix} (x - \alpha Q x + \alpha A^T y)^+ - x \\ \alpha(-Ax + q) \end{pmatrix},$$

with $c=[c_1^1, c_2^1, \ldots, c_{n_1}^1, c_1^2, c_2^2, \ldots, c_{n_2}^2, \ldots, c_{n_N}^N]^T$, $q=[q_1^1, q_2^1, \ldots, q_{n_1}^1, q_1^2, q_2^2, \ldots, q_{n_2}^2, \ldots, q_{n_N}^N]^T$, and $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

with entries of each block given by $[G^{ij}]_{kl} = \langle \phi_k^i, \phi_l^j \rangle$.

Figure 4:
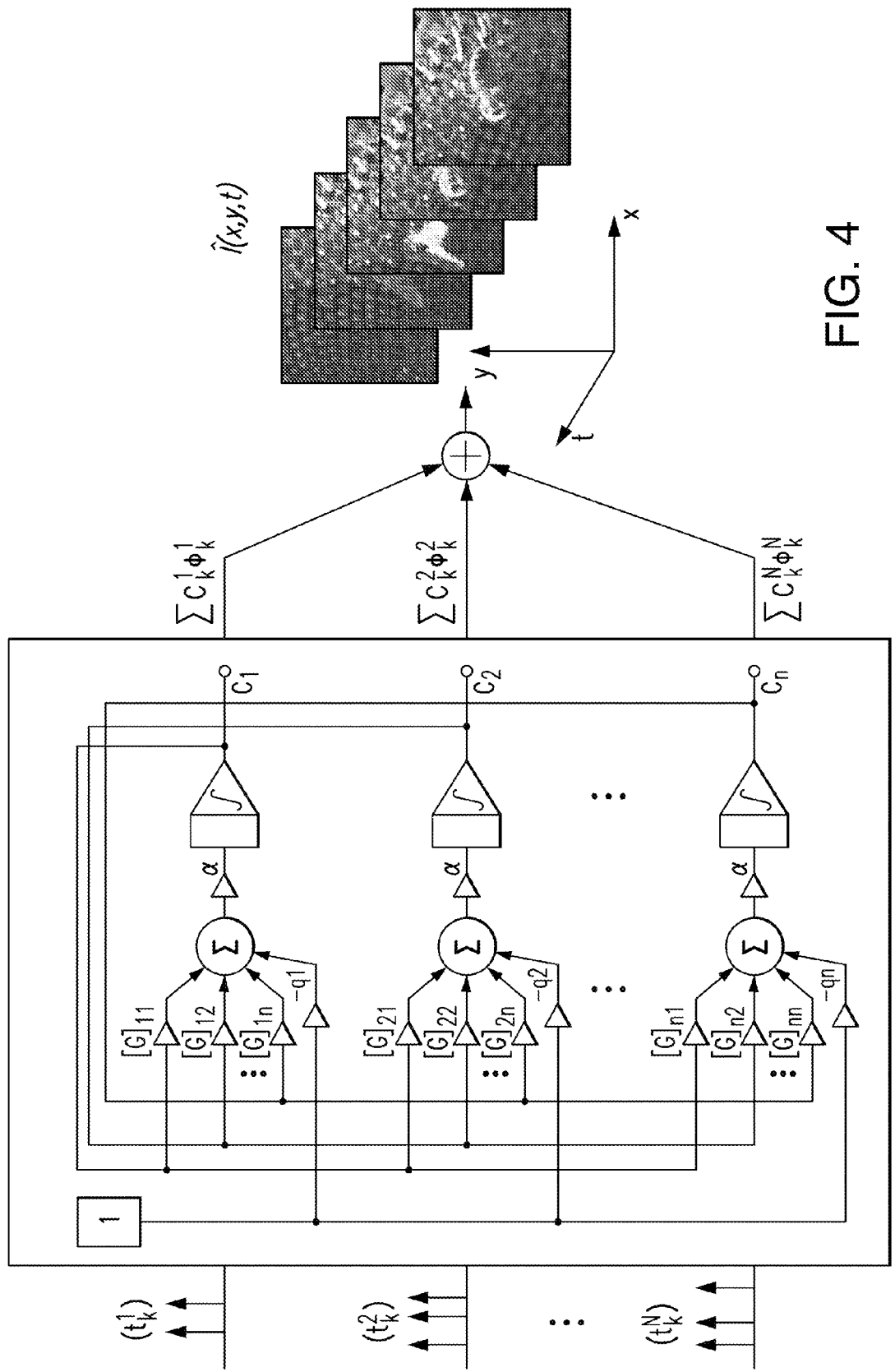
FIG. 4 is a schematic diagram of a recurrent neural network according to one embodiment the disclosed subject matter for reconstructing vTEM encoded signals.

A schematic diagram of an exemplary embodiment of the disclosed subject matter is depicted in FIG. 4.

Figure 5A:
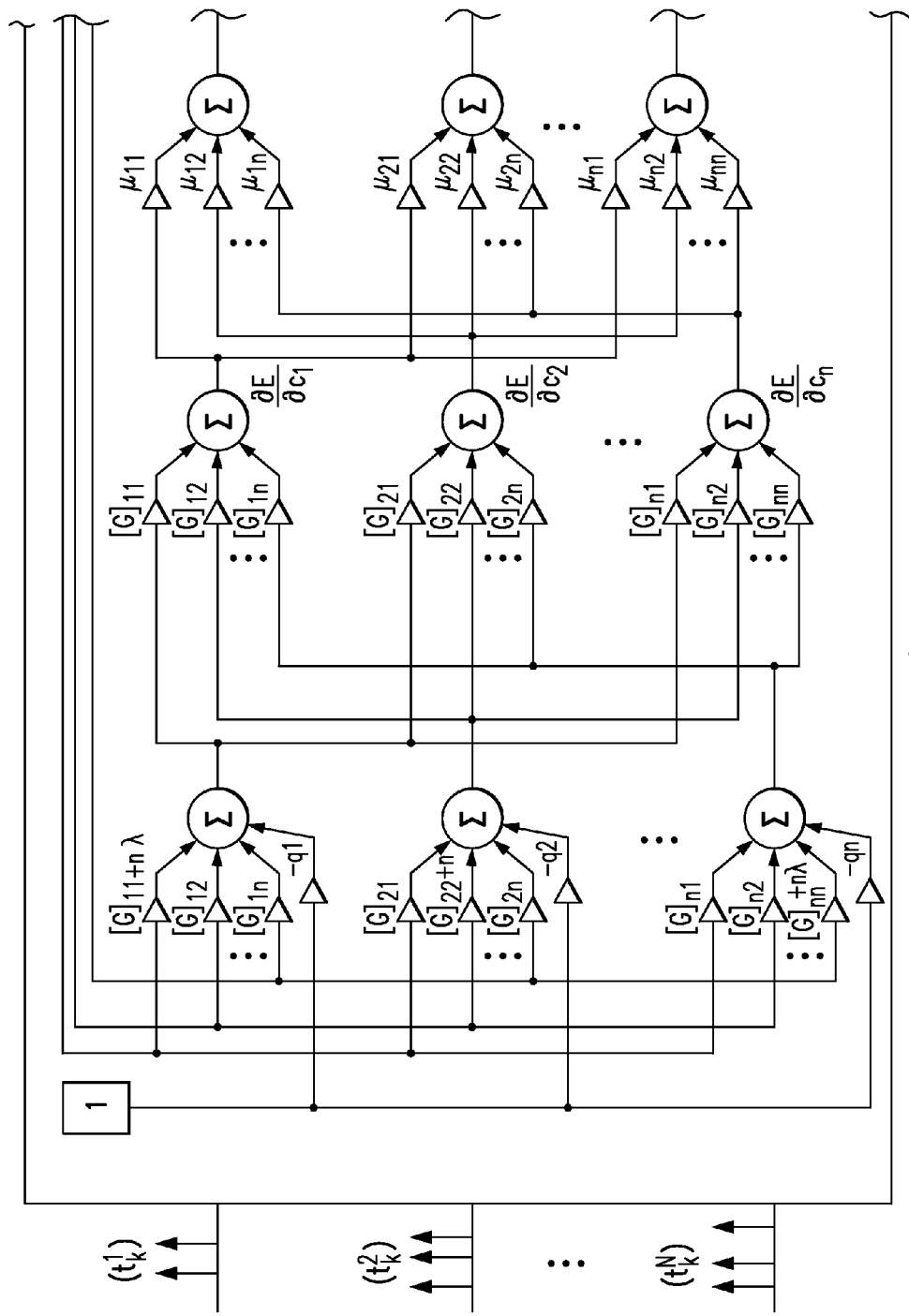

In some embodiments of the presently disclosed subject matter, the vTEM encoded signal can be encoded with neurons with a random threshold. Reconstruction of signals encoded with neurons with a random threshold can again be formulated as a variational approach, for example, by considering the reconstruction as the solution to a smoothing spline problem. FIG. 5A-FIG. 5B is a schematic representation of a recurrent neural network for decoding signals encoded with a vTEM with neurons with random threshold.

In one aspect of the disclosed subject matter, a system for reconstructing a TEM-encoded signal using a recurrent neural network comprises at least one input for receiving a TEM-encoded signal. Adders, integrators, multipliers, and/or piecewise linear activators can be arrange suitably such that the neural network is a map of at least one differential equation. The signal can be input into the at least one input, processed by the neural network, and output through at least one output. The neural network can also have a feedback, such that the outer layer sends a signal back to the first layer of the network. The outputs can be optionally integrated or otherwise processed.

In one embodiment, the system for reconstructing a TEM-encoded signal can comprise a GPU cluster. For example, a GPU's intrinsically parallel architecture can be exploited to realize a recurrent neural network. Multiple GPUs can be used for signal reconstruction, hosts of which can be connected using a switch fabric and peer-to-peer communication accomplished, for example, though the Message Passing Interface (MPI).

Figure 6:
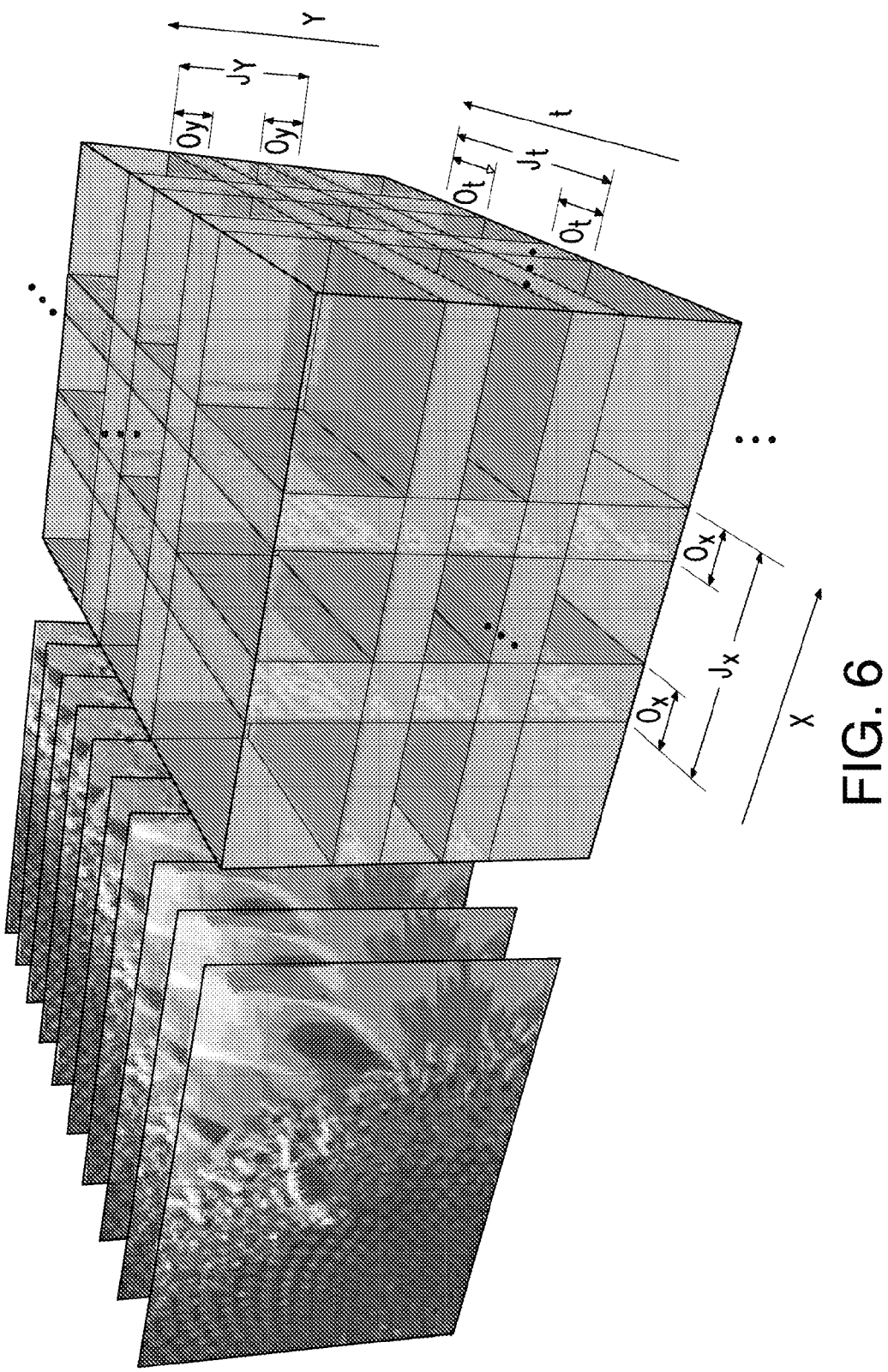
FIG. 6. illustrates how a signal can be divided into overlapping volumes and stitched according to one embodiment of the disclosed subject matter.

In another aspect of the disclosed subject matter, vTEM encoded signals can be first divided into smaller volumes. The volumes can then be reconstructed and finally the reconstructed volumes can be stitched together. For example, in one embodiment, a space-time video sequence can be divided into fixed sized, overlapping volume segments. FIG. 6 depicts an exemplary division of a space-time video sequence. The stitching can be accomplished according to known methods. Exemplary stitching methods are disclosed in Lazar, A. A., Simonyi, E. K., & Toth, L. T., *An overcomplete stitching algorithm for time decoding machines*, IEEE Transactions on Circuits and Systems-I: Regular Papers, 55, 2619-2630 (2008), the contents of which are incorporated by reference herein.

The disclosed subject matter and methods can be implemented in software stored on computer readable storage media, such as a hard disk, flash disk, magnetic tape, optical disk, network drive, or other computer readable medium. The software can be performed by a processor capable of reading the stored software and carrying out the instructions therein.

The foregoing merely illustrates the principles of the disclosed subject matter. Various modifications and alterations to the described embodiments will be apparent to those skilled in the art in view of the teaching herein. It will thus be appreciated that those skilled in the art will be able to devise numerous techniques which, although not explicitly described herein, embody the principles of the disclosed subject matter and are thus within the spirit and scope of the disclosed subject matter.

We claim:

1. A method of reconstructing a signal encoded with a time encoding machine (TEM) using a recurrent neural network, comprising:
   a. receiving a TEM-encoded signal;
   b. processing the TEM-encoded signal for input into a recurrent neural network;
   c. reconstructing the TEM-encoded signal with the recurrent neural network, comprising:
   d. formulating the reconstruction into a variational problem having a solution equal to the series of sums of a sequence of functions multiplied by a sequence of coefficients, wherein the coefficients can be obtained by solving a quadratic problem;

e. solving the quadratic problem with a recurrent neural network, by integrating time derivatives and providing the outputs back to the recurrent neural network, thereby generating the coefficients for the solution; and f. reconstructing the signal with the coefficients.

2. The method of claim 1, wherein the quadratic problem is an unconstrained quadratic problem with an explicit analytical solution.

3. The method of claim 2, wherein the recurrent neural network solves the unconstrained quadratic problem using a general gradient approach.

4. The method of claim 3, wherein the recurrent neural network has a plurality of outputs, each output corresponding to a coefficient.

5. The method of claim 1, wherein reconstructing further comprises a. formulating the reconstruction into a variational problem having a solution equal to the series of sums of a sequence of functions multiplied by a sequence of coefficients, wherein the coefficients can be obtained by solving a spline interpolation problem;

b. solving the interpolation problem with a recurrent neural network, thereby generating the coefficients to the solution; and c. reconstructing the signal with the coefficients.

6. The method of claim 5, wherein the spline interpolation problem is reformulated as a standard quadratic programming problem.

7. The method of claim 1, wherein the TEM-encoded signal is one dimensional, and wherein reconstructing further comprises:

a. formulating the reconstruction as the variational problem $$\hat{u} = \underset{u \in \mathcal{H}}{\operatorname{argmin}} \left\{ \sum_{k=1}^{n} (\langle u, \phi_k \rangle - q_k)^2 + n\lambda \|u\|_{\mathcal{H}}^2 \right\},$$

the solution of which takes the form $$\hat{u} = \sum_{k=1}^{n} c_k \phi_k,$$

where coefficients $c_k$ can be obtained by solving an unconstrained quadratic problem minimize $\|Gc-q\|_{1/2}^2 + n\lambda c^T Gc$ having an explicit analytical solution $G^T(G=n\lambda I)c=G^T q$, where $c=[c_1, c_2, \ldots, c_n]^T$, $q=[q_1, q_2, \ldots, q_n]^T$, and G is a symmetric matrix with entries $$[G]_{k,l} = \langle \phi_k, \phi_l \rangle = \sum_{m_t=-M_t}^{M_t} \left( \int_k^{k+1} (D_T * e_{-m_t})(s)\,ds \cdot \int_l^{l+1} (D_T * e_{m_t})(s)\,ds \right);$$

and b. solving the unconstrained quadratic problem with a recurrent neural network.

8. The method of claim 7, wherein a set of differential equations, $$\frac{dc}{dt} = -\mu \nabla E(c),$$

with initial condition $c(0)=0$, where $E(c)=\frac{1}{2}(\|Gc-q\|_{1/2}^2 + n\lambda c^T Gc)$, and $\mu(c, t)$ is a n×n symmetric positive definite matrix that determines the speed of convergence and whose entries are usually dependent on the variables $c(t)$ and time t, define the architecture of the recurrent neural network.

9. The method of claim 8, wherein the recurrent neural network solves the unconstrained quadratic problem using a general gradient approach.

10. The method of claim 1, wherein the TEM-encoded signal is one dimensional, and wherein reconstructing further comprises:

a. formulating the reconstruction as a spline interpolation problem, $$\hat{u} = \underset{u \in \mathcal{H}, \{\mathcal{L}_k u = q_k\}_{k=t}^{n}}{\operatorname{argmin}} \{\|u\|_{\mathcal{H}}^2\},$$

the solution to which takes the form $$\hat{u} = \sum_{k=1}^{n} c_k \phi_k,$$

where coefficients $c_k$ are the solution to the systems of linear equations Gc=q, and where coefficients $c_k$ can be obtained by solving the quadratic problem $$\operatorname{minimize} \frac{1}{2} c^T Gc,$$
$$\operatorname{subject\ to}\ Gc = q$$

where $c=[c_1, c_2, \ldots, c_n]^T$, $q=[q_1, q_2, \ldots, q_n]^T$, and G is a symmetric matrix with entries $$[G]_{k,l} = \langle \phi_k, \phi_l \rangle = \sum_{m_t=-M_t}^{M_t} \left( \int_k^{k+1} (D_T * e_{-m_t})(s)\,ds \cdot \int_l^{l+1} (D_T * e_{m_t})(s)\,ds \right);$$

b. solving the quadratic problem with a recurrent neural network.

11. The method of claim 10, wherein the quadratic problem is reformulated as a standard quadratic programming problem, setting $x=[x_+^T x_-^T]^T$ and imposing $x_+ \geq 0$, $x_- \geq 0$ such that $c=x_+ - x_-$, giving a convex programming problem $$\operatorname{minimize} \frac{1}{2} x^T Qx,$$
$$\operatorname{subject\ to}\ Ax = q, x \geq 0$$

where $$Q = \begin{bmatrix} G & -G \\ -G & G \end{bmatrix},$$

and where A=[G −G], and wherein the recurrent neural network is given by $$\frac{d}{dt}\begin{pmatrix} x \\ y \end{pmatrix} = \beta \begin{pmatrix} (x - \alpha Qx + \alpha A^T y)^+ - x \\ \alpha(-Ax + q) \end{pmatrix},$$

where $(x)^+ = [(x_1)^+, \ldots, (x_n)^+]^T$ and $(x_i)^+ = \max\{0, x_i\}$, $\alpha$ is a positive constant and $\beta > 0$ is the scaling constant.

12. The method of claim 1, wherein the TEM-encoded signal is a multidimensional signal encoded with a video time encoding machine (vTEM).

13. The method of claim 12, wherein reconstructing further comprises:
   a. formulating the reconstruction as the variational problem $$\hat{I} = \operatorname*{argmin}_{I \in \mathcal{H}} \left\{ \sum_{j=1}^{N} \sum_{k=1}^{n_j} (\langle I, \phi_k^j \rangle - q_k^j)^2 + n\lambda \|I\|_{\mathcal{H}}^2 \right\},$$

the solution of which takes the $$\hat{I} = \sum_{j=1}^{N} \sum_{k=1}^{n_j} c_k^j \phi_k^j,$$

form where $c = [c_1^1, c_2^1, \ldots, c_{n_1}^1, c_1^2, c_2^2, \ldots, c_{n_2}^2, \ldots, c_{n_N}^N]^T$ satisfies the system of linear equations $G^T(G+n\lambda I)c = G^T q$ with $q = [q_1^1, q_2^1, \ldots, q_{n_1}^1, q_1^2, q_2^2, \ldots, q_{n_2}^2, \ldots, q_{n_N}^N]^T$, I the n×n identity matrix and G the block matrix $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

with entries of each block given by $[G^{ij}]_{ki} = \langle \phi_k^i, \phi_j^j \rangle$;
   b. solving the system of linear equations with a recurrent neural network.

14. The method of claim 13, wherein a set of differential equations, $$\frac{dc}{dt} = -\mu \nabla E(c),$$

with initial condition $c(0)=0$, where $E(c) = \frac{1}{2}(\|Gc-q\|_{1/2}^2 + n\lambda c^T Gc)$, and $\mu(c, t)$ is a n×n symmetric positive definite matrix that determines the speed of convergence and whose entries are usually dependent on the variables c(t) and time t, define the architecture of the recurrent neural network.

15. A system for reconstructing a signal encoded with a time encoding machine (TEM) using a recurrent neural network circuit, comprising:
   a. at least one input for receiving a TEM-encoded signal, wherein the TEM-encoded signal comprises at least one spike train;
   b. at least one processor electrically coupled with the at least one input for determining characteristics of the at least one spike;
   c. a recurrent neural network circuit electrically coupled with the at least one processor, wherein the recurrent neural network circuit is configured with reference to the characteristics of the at least one spike train, and wherein reconstructing the encoded signal is formulated into a variational problem having a solution equal to the series of sums of a sequence of functions multiplied by a sequence of coefficients, wherein the coefficients can be obtained by solving a quadratic problem;
   d. the recurrent neural network circuit comprises an arrangement of adders, integrators, multipliers, and/or piecewise linear activators capable of solving the quadratic problem by integrating time derivatives and providing the outputs back to the recurrent neural network circuit, thereby generating the coefficients for the solution; and
   e. at least one output electrically coupled to the recurrent neural network circuit for providing a reconstructed signal.

16. The system of claim 15, wherein the recurrent neural network circuit is arranged into three layers, comprising:
   a. a first layer, consisting of a plurality (n) of multiply/add units, wherein the vector $(G+n\lambda I)c-q$ is computed, wherein the multiplication factors are entries of the matrix $G+n\lambda I$ and the vector q;
   b. a second layer, consisting of a plurality (n) of multiply/add units, wherein Error! Bookmark not defined. $\nabla E(c)$ is evaluated, where $\nabla E(c) = G^T(G+n\lambda I)c-q)$, and wherein multiplication factors are provided by the entries of matrix G;
   c. a third layer, consisting of a plurality (n) of multiply/add units, wherein the gradient is weighted by the learning rate $\mu$, and wherein the outputs of the third layer provide the time derivative of the vector c(t), the outputs of the third layer being integrated and fed back into the first layer.

17. The system of claim 15, wherein the recurrent neural network is arranged into a single layer, comprising:
   a. a plurality (n) of multiply/add units, wherein a vector (q=Gc) is computed, and wherein a plurality of multiplication factors are entries of a matrix G and the vector q;
   b. a plurality of outputs, wherein the outputs provide a time derivative of a vector c(t), the outputs being integrated and fed back into the first layer.

18. The system of claim 15, wherein the at least one input comprises a single input, and the at least one output comprises a plurality of outputs.

19. The system of claim 15, wherein the at least one input comprises a plurality of inputs, and the at least one output comprises a plurality of outputs.

* * * * *